(12) United States Patent
Iwaki

(10) Patent No.: US 10,264,719 B2
(45) Date of Patent: Apr. 16, 2019

(54) COMPONENT SUPPLY DEVICE

(71) Applicant: FUJI CORPORATION, Chiryu-shi (JP)

(72) Inventor: Noriaki Iwaki, Hekinan (JP)

(73) Assignee: FUJI CORPORATION, Chiryu-shi (JP)

( * ) Notice: Subject to any disclaimer, the term of this patent is extended or adjusted under 35 U.S.C. 154(b) by 6 days.

(21) Appl. No.: 15/518,537

(22) PCT Filed: Nov. 6, 2014

(86) PCT No.: PCT/JP2014/079432
§ 371 (c)(1),
(2) Date: Apr. 12, 2017

(87) PCT Pub. No.: WO2016/071984
PCT Pub. Date: May 12, 2016

(65) Prior Publication Data
US 2017/0238448 A1 Aug. 17, 2017

(51) Int. Cl.
*B23P 19/00* (2006.01)
*H05K 13/04* (2006.01)
(Continued)

(52) U.S. Cl.
CPC ............ *H05K 13/043* (2013.01); *B23P 19/00* (2013.01); *B25J 13/08* (2013.01); *B65G 47/12* (2013.01); *H05K 13/028* (2013.01)

(58) Field of Classification Search
CPC ........ H05K 13/043; B25J 13/08; B65G 47/12
See application file for complete search history.

(56) References Cited

U.S. PATENT DOCUMENTS 4,909,376 A * 3/1990 Herndon ................ B25J 9/1697
198/395
5,084,959 A * 2/1992 Ando ..................... H01L 21/681
29/720
(Continued)

FOREIGN PATENT DOCUMENTS

EP 0 544 833 A1 6/1993
JP 10-202569 A 8/1998
(Continued)

OTHER PUBLICATIONS

Extended European Search Report dated Oct. 20, 2017 in Patent Application No. 14905281.3.
(Continued)

*Primary Examiner* — Patrick H Mackey
(74) *Attorney, Agent, or Firm* — Oblon, McClelland, Maier & Neustadt, L.L.P.

(57) ABSTRACT

Multiple types of leaded components 410a, 410b, and 410c are scattered on component support member 285, and those multiple types of components are imaged by an imaging device. Identification information for identifying each type of the multiple types of components, and position information representing the position of the components on the component support section, is acquired from image data captured by the imaging device 84. Then, based on the identification information and the position information, any of the multiple types of components on the component support member 285 are held by a holding tool. By this, it is possible to pick up any of the multiple types of components scattered on the component support section 285 and it is possible to supply many types of components using the component supply device 32. Also, there is no need for an operator to check components on the component support section 285, so the operator workload is reduced.

6 Claims, 16 Drawing Sheets

(51) Int. Cl.
     *B25J 13/08*      (2006.01)
     *B65G 47/12*     (2006.01)
     *H05K 13/02*     (2006.01)

(56) References Cited

U.S. PATENT DOCUMENTS

| | | | | |
|---|---|---|---|---|
| 5,314,055 | A * | 5/1994 | Gordon | B25J 9/1697 |
| | | | | 198/395 |
| 5,687,831 | A * | 11/1997 | Carlisle | A61F 11/12 |
| | | | | 198/395 |
| 6,056,108 | A * | 5/2000 | Buchi | B25J 9/1697 |
| | | | | 198/395 |
| 6,481,560 | B2 * | 11/2002 | Kearney | B65G 47/1478 |
| | | | | 198/396 |
| 8,550,233 | B2 * | 10/2013 | Perroud | B65G 27/34 |
| | | | | 198/502.2 |
| 9,949,417 | B2 * | 4/2018 | Morikawa | B23P 19/001 |
| 2007/0007924 | A1 | 1/2007 | Nishihara et al. | |
| 2010/0094453 | A1 | 4/2010 | Nishihara et al. | |

FOREIGN PATENT DOCUMENTS

| | | |
|---|---|---|
| JP | 2007-15055 A | 1/2007 |
| WO | WO 92/03364 A1 | 3/1992 |

OTHER PUBLICATIONS

International Search Report dated Feb. 3, 2015, in PCT/JP2014/079432, filed Nov. 6, 2014.

\* cited by examiner

COMPONENT SUPPLY DEVICE

TECHNICAL FIELD

The present application relates to a component supply device provided with a component support section that supports multiple components in a scattered state.

BACKGROUND ART

Among component supply devices, there is a device that scatters multiple components on a component support section and uses operation of a component holding robot or the like to pick up the components scattered on the component support section. An example of such a component supply device is disclosed in the patent literature below.

Patent literature 1: JP-A-H10-202569

SUMMARY

With the component supply device disclosed in the above patent literature, multiple components of a single type are scattered on a component support section, and any one of the multiple components of the single type are picked up. Therefore, it is not possible to supply many types of components, meaning that convenience is poor. Also, an operator must pay attention to ensure that other types of components are not mixed on the component support section, making the burden on the operator large. Thus, there is room for improvement in component supply devices that include a component support section, and the practicality of a component supply device can be improved by performing various improvements. An object of the present disclosure is to provide a highly practical component supply device that takes account of the above circumstances.

To solve the above problems, the present disclosure of a component supply device includes: a component support section configured to support multiple types of components in a scattered state; an imaging device configured to image the component supported by the component support section; a holding tool configured to hold the component supported by the component support section; a moving device configured to move the holding tool to any position above the component support section; and a control section configured to control operation of the holding tool and the moving device, wherein the control section includes an information acquiring section configured to acquire identification information for identifying each type of the multiple types of components and position information representing a position of each of the multiple types of components on the component support section, based on image data captured by the imaging device, and an operation control section configured to control operation of the holding tool and the moving device based on the identification information and the position information acquired by the information acquiring section, such that any type of the multiple types of components supported by the component support section can be held by the holding tool.

ADVANTAGEOUS EFFECTS

With the present disclosure of a component supply device, multiple types of components are scattered on a component support section and those multiple types of components are imaged by an imaging device. Identification information for identifying each type of the multiple types of components, and position information representing the position of each of the multiple types of components on the component support section, is acquired from image data captured by the imaging device. Then, based on the identification information and the position information, any of the multiple types of components supported by the component support section can be held by a holding tool. In this manner, with the component supply device of the present disclosure, it is possible to pick up any of the multiple types of components from the multiple types of components scattered on the component support section. By this, it is possible to supply many types of components using the component supply device. Also, there is no need for an operator to check components on the component support section, thus reducing the workload on the operator.

DESCRIPTION OF PREFERRED EMBODIMENTS

The following describes in detail referring to the figures an example embodiment of the present disclosure.
Configuration of Component Mounter.

Figure 1:
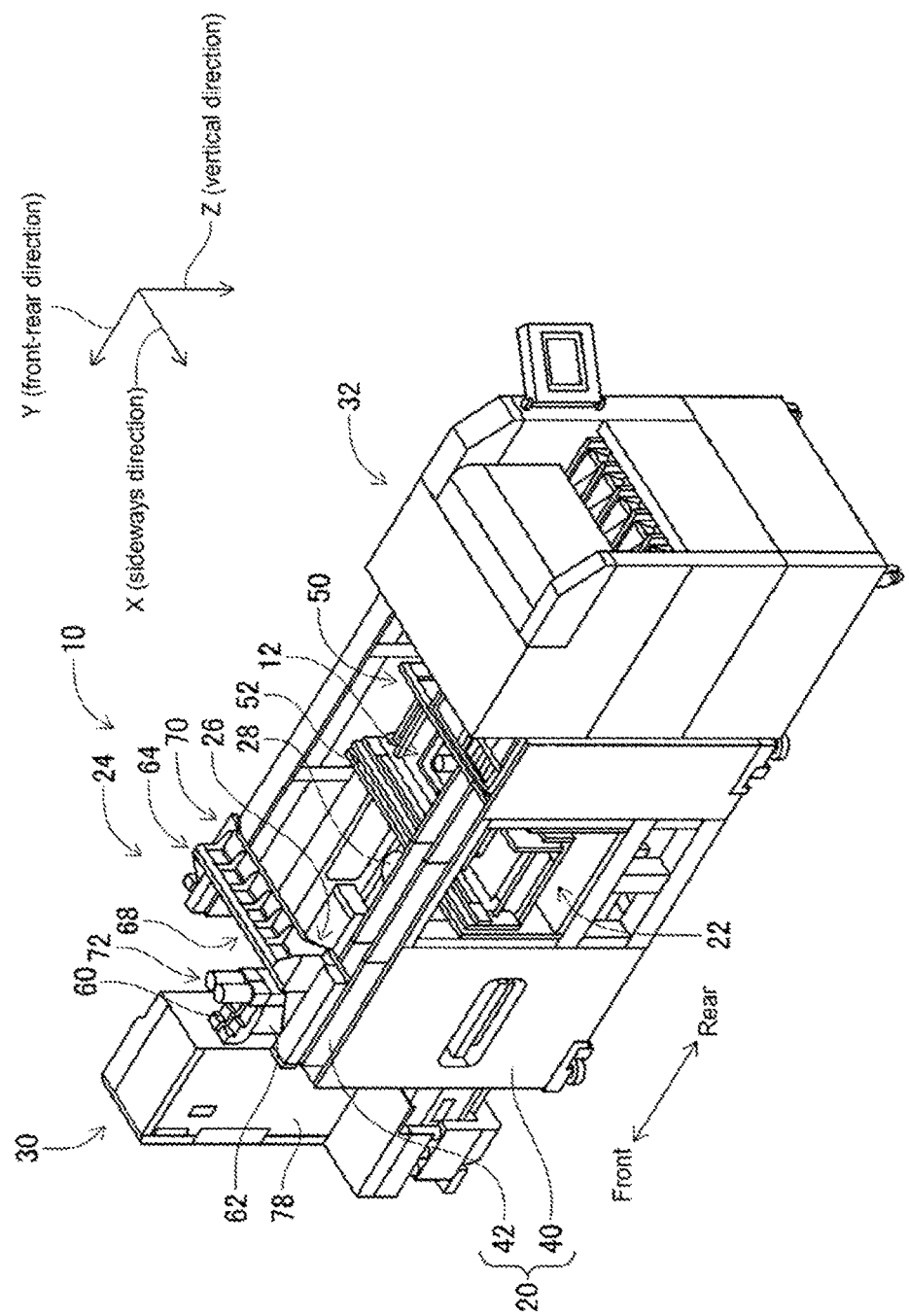
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device (refer to FIG. 13) 34. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
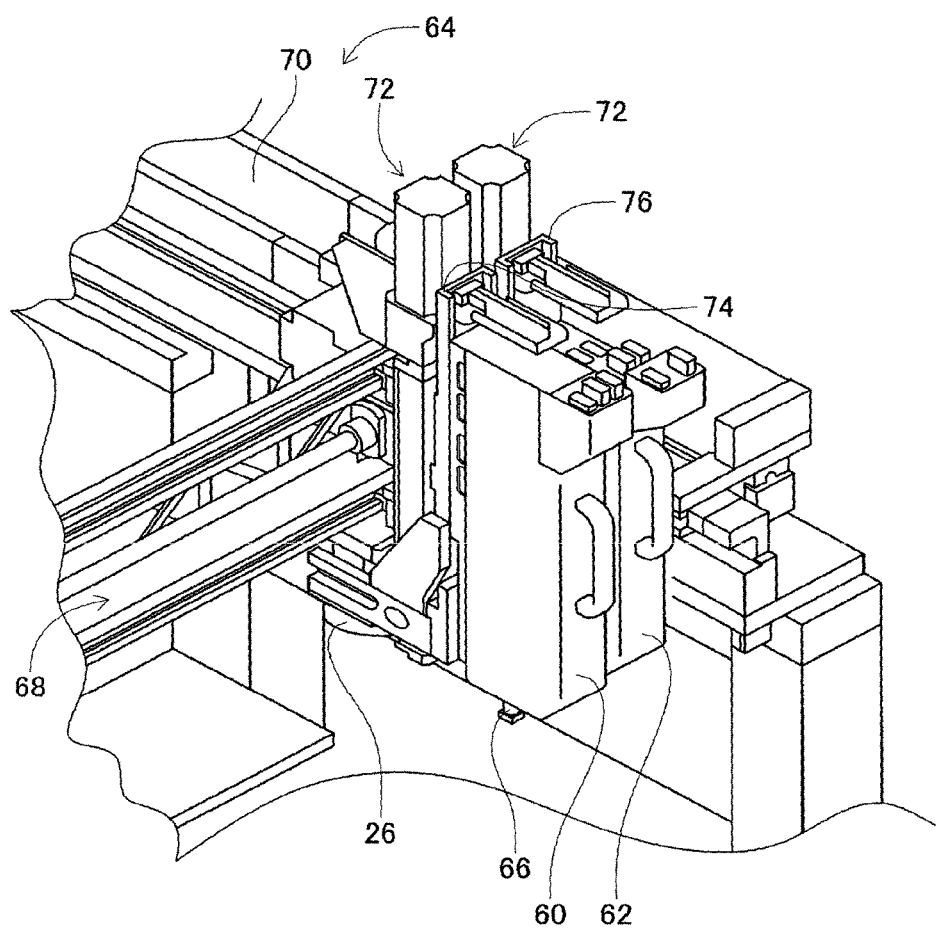
FIG. 2 is a perspective view showing a component mounting device of the component mounter.

Component mounting device 24 is provided on beam section 42, and includes work heads 60 and 62 and work head moving device 64. Each work head 60 and 62 includes holding tool (refer to FIG. 2) 66 such as a chuck or suction nozzle, and holds a component using holding tool 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. Thus, imaging device 28 images a component held by component holding tool 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
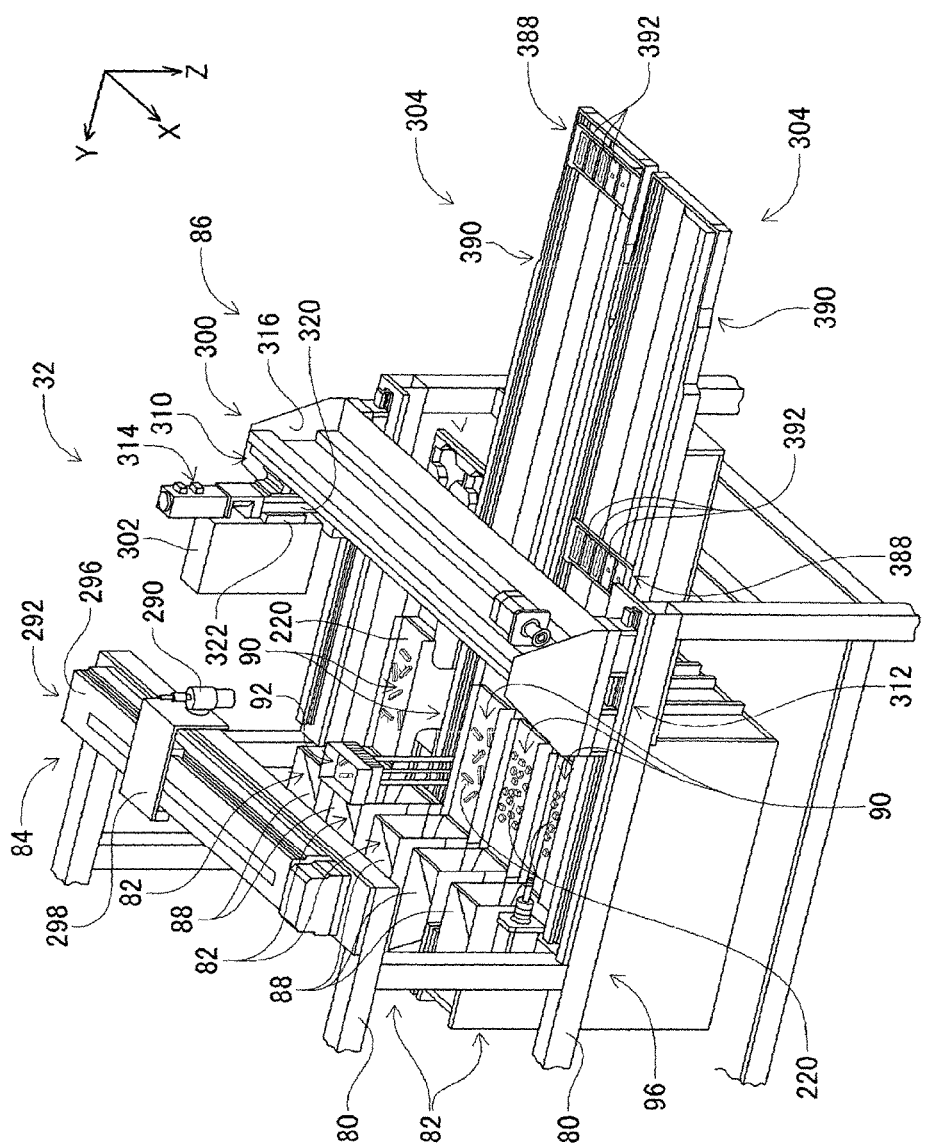
FIG. 3 is a perspective view of a loose component supply device.
Figure 4:
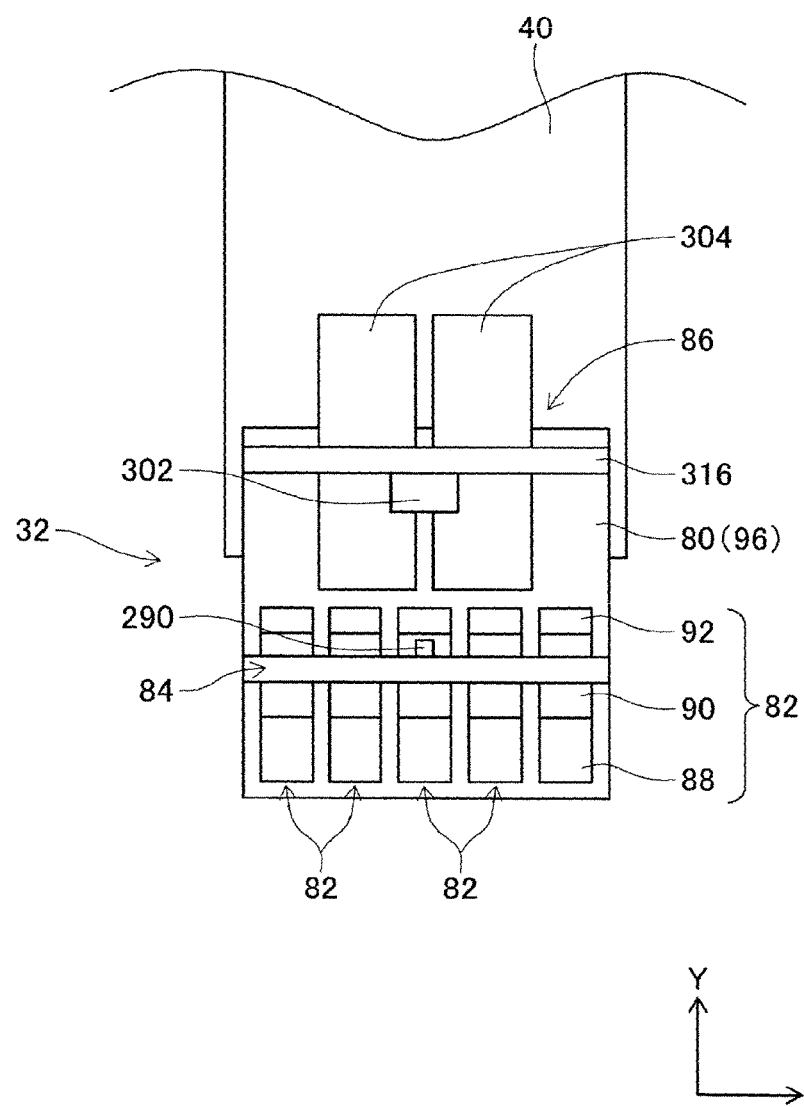
FIG. 4 is a plan view of the loose component supply device.

As shown in FIGS. 3 and 4, loose component supply device 32 includes main body 80, component supply unit 82, imaging device 84, and component transfer device 86.

(a) Component Supply Unit

Component supply unit 82 includes component supply apparatus 88, component scattering device 90, and component returning device 92, with those supply apparatus 88, component scattering device 90, and component returning device 92 configured to be integrated as one. Component supply unit 82 is assembled to be removable from base 96 of main body 80, and with loose component supply device 32, five component supply units 82 are arranged in one row in the X direction.

(i) Component Supply Apparatus

Figure 5:
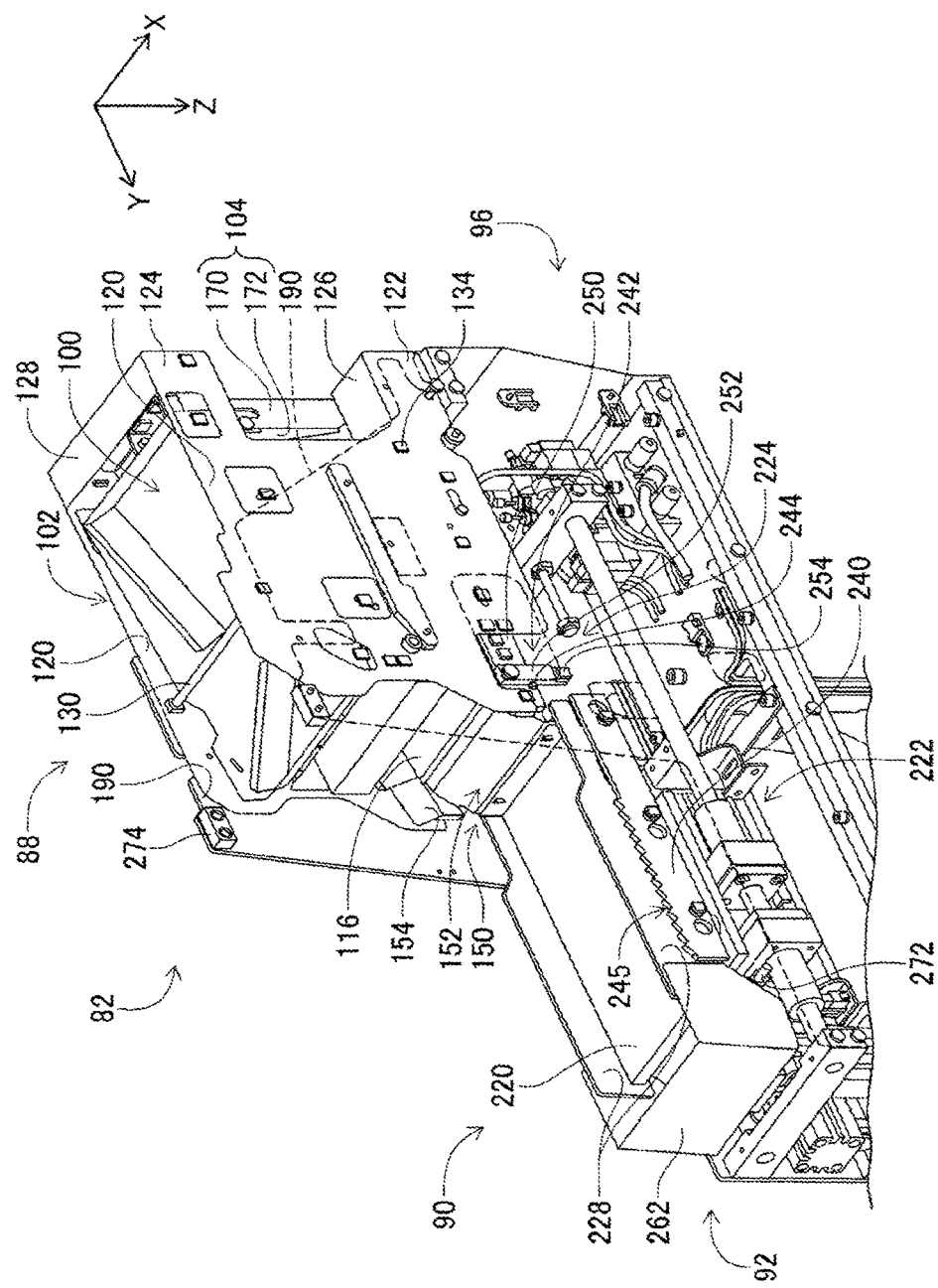
FIG. 5 is a perspective view of a component supply unit.

As shown in FIG. 5, component supply apparatus 88 includes component storage apparatus 100, housing 102, and grip 104. Component storage apparatus 100 has a general shape of a rectangular parallelepiped and is open at the top surface and a front surface. The bottom surface of component storage apparatus 100 is inclined surface 116, which is inclined towards the open front surface of component storage apparatus 100.

Housing 102 includes pair of side walls 120. This pair of side walls 120 have a largely rectangular shape and are arranged facing each other so as to sandwich component storage apparatus 100. Pair of protruding sections 122 and 124 that protrude in a C-shape are formed at the rear side of each side wall 120. Pair of side walls 120 are connected at protruding sections 122 and 124 via connecting members 126 and 128. Further, pair of side walls 120 are connected at an upper section by connecting rod 130, and at a lower section by a connecting rod (not shown). Note that, the distance between the pair of side walls 120 is slightly longer than the width of component storage apparatus 100 sandwiched by the pair of side walls 120.

Support shaft 134 spans the pair of side walls 120 at a base section of protruding section 122, and component storage apparatus 100 is supported on support shaft 134 in a swingable manner. That is, component storage apparatus 100 is swingable inside housing 102 around support shaft 134. Further, component ejection member 150 is fixedly provided between the pair of side walls 120 so as to be positioned in front of the lower front end of component storage apparatus 100. Component ejection member 150 includes inclined plate 152, and pair of side plates (only one of which is shown) 154 established at each end in the width direction of inclined plate 152. Inclined plate 152 is inclined downwards towards the front side.

Grip 104 is configured from fixed holding member 170 and movable holding member 172. Fixed holding member 170 is a rectangular tube with one open side. Fixed holding member 170 is fixed to connecting member 128 at an upper end section in a state with the open side facing between the pair of side walls 120, and is fixed at a lower end section to connecting section 126. Further, movable holding member 172 is also a rectangular tube and fits inside fixed holding member 170 from the open side of fixed holding member 170. And, movable holding member 172 is swingably supported at a lower portion by connecting member 126. By this, movable holding member 172 is swingable around a lower portion thereof, such that an upper portion of movable holding member 172 approaches and separates from fixed holding member 170.

An upper portion of movable holding member 172 is connected to the rear surface of component storage apparatus 100 by a connecting arm (not shown). Therefore, when movable holding member 172 swings, component storage apparatus 100 also swings. That is, when the upper portion of movable holding member 172 swings in a direction away from fixed holding member 170, component storage apparatus 100 swings downwards. Conversely, when the upper portion of movable holding member 172 swings in a direction approaching fixed holding member 170, component storage apparatus 100 swings upwards.

Also, a spring (not shown) is provided in a compressed state between fixed holding member 170 and movable holding member 172. Therefore, movable holding member 172 is biased in a direction away from fixed holding member 170 by the elastic force of the spring. That is, usually, when the upper portion of movable holding member 172 swings in a direction away from fixed holding member 170, component storage apparatus 100 swings downwards. Here, the front side end portion of inclined surface 116 of component storage apparatus 100 faces the rear side end portion of inclined plate 152 substantially without a gap.

Also, component supply apparatus 88 is attached to the pair of side frame sections 190 assembled to base 96 in a removable manner. In detail, the pair of side frame sections 190 are largely plate-shaped, and are arranged to face each other separated by a specified distance. The distance between the pair of side frame sections 190 is the dimension in the width direction of component supply apparatus 88, that is, slightly longer than the distance between the pair of side walls 120. Therefore, component supply apparatus 88 is inserted between the pair of side frame sections 190.

Also, a lock mechanism (not shown) is provided on a lower portion of movable holding member 172 of grip 104, and in a state with movable holding member 172 biased in a direction away from fixed holding member 170 by the elastic force of a spring, that is, usually, component supply apparatus is locked between the pair of side frame sections 190 by the lock mechanism. On the other hand, in a case in which an operator has gripped grip 104, movable holding member 172 approaches fixed holding member 170 against the elastic force of the spring. In this case, the lock mechanism provided on the lower portion of movable holding member 172 is released. By this, by an operator raising component supply apparatus 88 in a state gripping grip 104 of component supply apparatus 88, component supply apparatus 88 is removed from the pair of side frame sections 190.

(ii) Component Scattering Device

Component scattering device 90 includes component support member 220, component support member moving device 222, and supply apparatus oscillating device 224. Component support member 220 is a roughly rectangular plate, and is provided to extend forwards from below inclined plate 152 of component supply apparatus 88. Side wall sections 228 are formed at each edge in the lengthwise direction of component support member 220.

Component support member moving device 222 is for moving component support member 220 forwards and backwards by the driving of electromagnetic motor (refer to FIG. 13) 236. By this, component support member 220 moves forwards and backwards slightly below the lower end of inclined plate 152 of component supply apparatus 88 in a state with the upper surface of component support member 220 horizontal. Note that, component support member 220 moves to and from a component supply position at which roughly the entire body of component support member 220 is exposed, and a retract position at which the entire body of component support member 220 is below component supply apparatus 88.

Supply apparatus oscillating device 224 includes cam member 240, cam follower 242, and stopper 244. Cam member 240 is roughly a plate and is fixed to an outer side surface of side wall section 228 extending in a front-rear direction. Multiple teeth 245 are formed at regular intervals in the front-rear direction on the upper end section of cam member 240. Cam follower 242 includes lever 252 and roller 254. Lever 252 is provided on the lower end section of side wall 120 of component supply apparatus 88 so as to extend in a vertical direction, and is supported by side wall 120 at the upper end section so as to be swingable around an axis line parallel to the width direction of component supply apparatus 88. Roller 254 is held by the bottom end of lever 252 to be rotatable around an axis line parallel to the width direction of component supply apparatus 88. Note that, lever 252 is biased in a direction facing forwards by the elastic force of a coil spring (not shown).

Stopper 244 is provided protruding from side wall 120, and lever 252 biased by the elastic force of the coil spring contacts stopper 244. Note that, lever 252 extends downwards in a vertical direction in a state contacting stopper 244.

(iii) Component Returning Device

Figure 6:
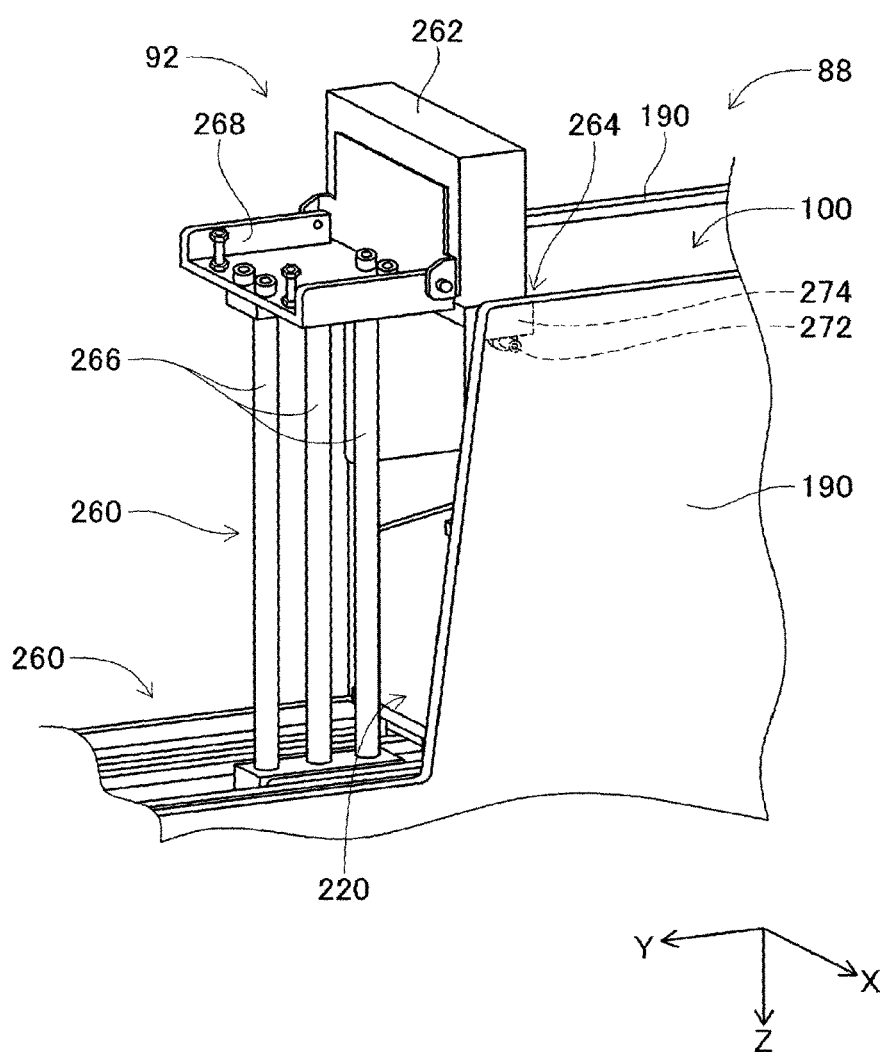
FIG. 6 is a perspective view showing the component supply unit in a state with a component collection container raised to an upper limit position.

As shown in FIG. 6, component returning device 92 includes container raising and lowering device 260, and component collection container 262. Container raising and lowering device 260 includes air cylinder 266 and raising and lowering member 268, and raising and lowering member 268 is raised and lowered by operation of air cylinder 266. Also, air cylinder 266 is fixed to the front side end of component support member 220. Accordingly, air cylinder 266 moves forwards and backwards together with component support member 220 by operation of component support member moving device 222.

Component collection container 262 is provided on the upper surface of raising and lowering member 268 and is moved up and down by operation of air cylinder 266. Here, component collection container 262 is moved to and from a raised position that is higher than component supply apparatus 88, and a lowered position that is below component support member 220.

Component collection container 262 is a box that is open at the top, and is supported on the top surface of raising and lowering member 268 to be rotatable around an axis line parallel to the width direction of component supply apparatus 88. Accordingly, component collection container 262 rotates to and from a component receiving state (the state of component collection container 262 in FIG. 14) in which the bottom surface is horizontal and it is possible to receive components from the entrance, and a component ejection state (the state of component collection container 262 in FIG. 6) in which the bottom surface is vertical and components can be ejected from the entrance. Note that, component collection container 262 is biased in the direction of the component receiving state by a coil spring (not shown).

As shown in FIG. 5, protruding pin 272 is provided on the rear side end section of component collection container 262. Protruding pin 272 protrudes towards the outside on the side of component collection container 262. Further, engaging block 274 is fixed to the inside of the front side top end section of side frame section 190. Also, as shown in FIG. 6, when component collection container 262 is raised to the raised position by operation of air cylinder 266, protruding pin 272 engages with engaging block 274. By this, component collection container 262 rotates and enters the component ejection state.

Note that, with loose component supply device 32, component supply units 82 are configured from component supply apparatus 88, component scattering device 90, and component returning device 92, and multiple component supply units with different widths are prepared. Specifically, compared to component supply unit 82 shown in FIGS. 3 to 6, there are component supply unit (refer to FIG. 7) 280 that is twice as wide, and component supply unit (refer to FIG.

8) 282 that is three times as wide. Note that, component supply units 280 and 282, similarly to component supply unit 82, are configured from a component supply apparatus, a component scattering device, and a component returning device; the component supply apparatus, the component scattering device, and the component returning device of component supply units 280 and 282 are just wider versions of component supply apparatus 88, component scattering device 90, and component returning device 92 of component supply unit 82, therefore descriptions are omitted.

Figure 7:
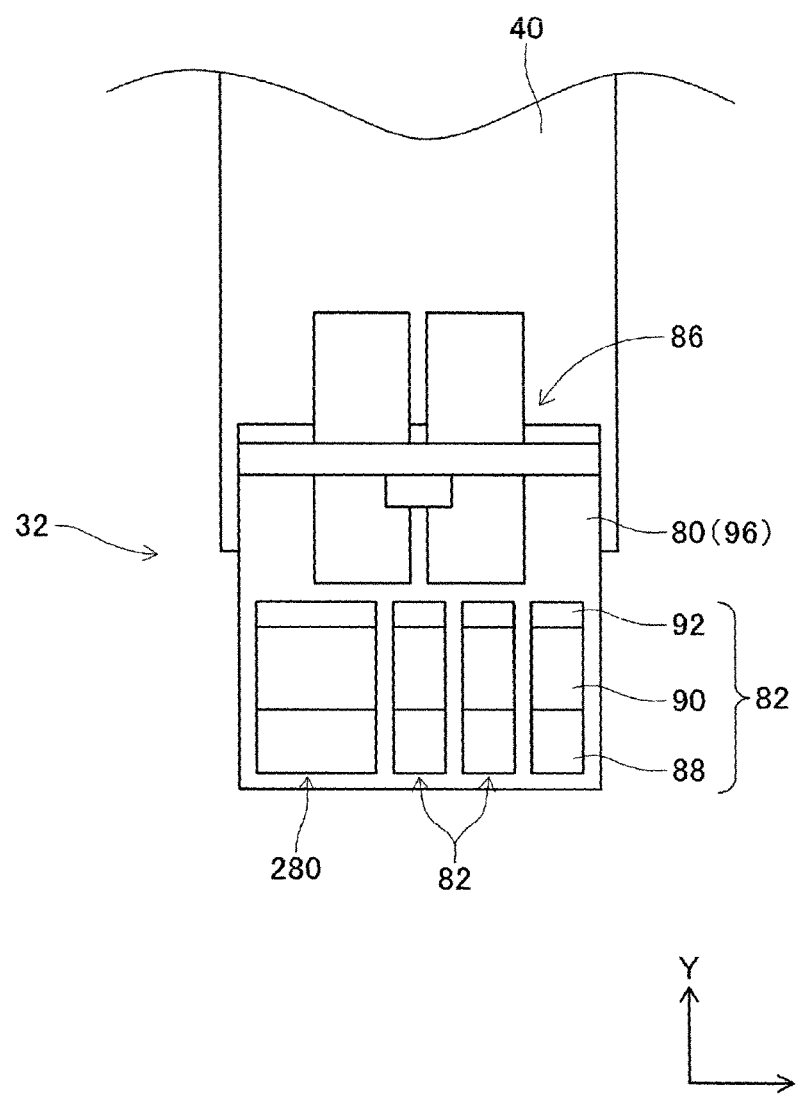
FIG. 7 is a plan view showing the loose component supply device with component supply units of different widths attached.
Figure 8:
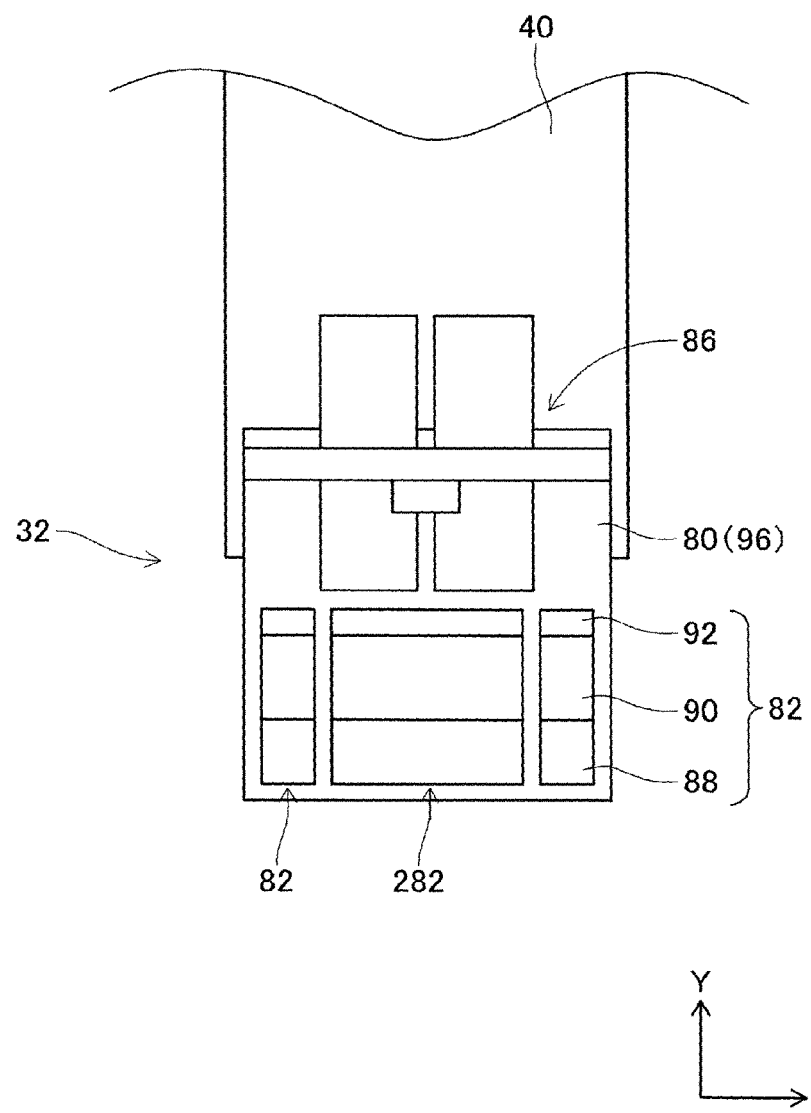
FIG. 8 is a plan view showing the loose component supply device with component supply units of different widths attached.

Component supply unit 82, as described above, is removably attached to base 96 of main body 80. Therefore, for example, two adjacent component supply units 82 can be removed from base 96, and as shown in FIG. 7, component supply unit 280 can be attached at that position. Also, for example, three adjacent component supply units 82 can be removed from base 96, and as shown in FIG. 8, component supply unit 282 can be attached at that position.

Figure 9:
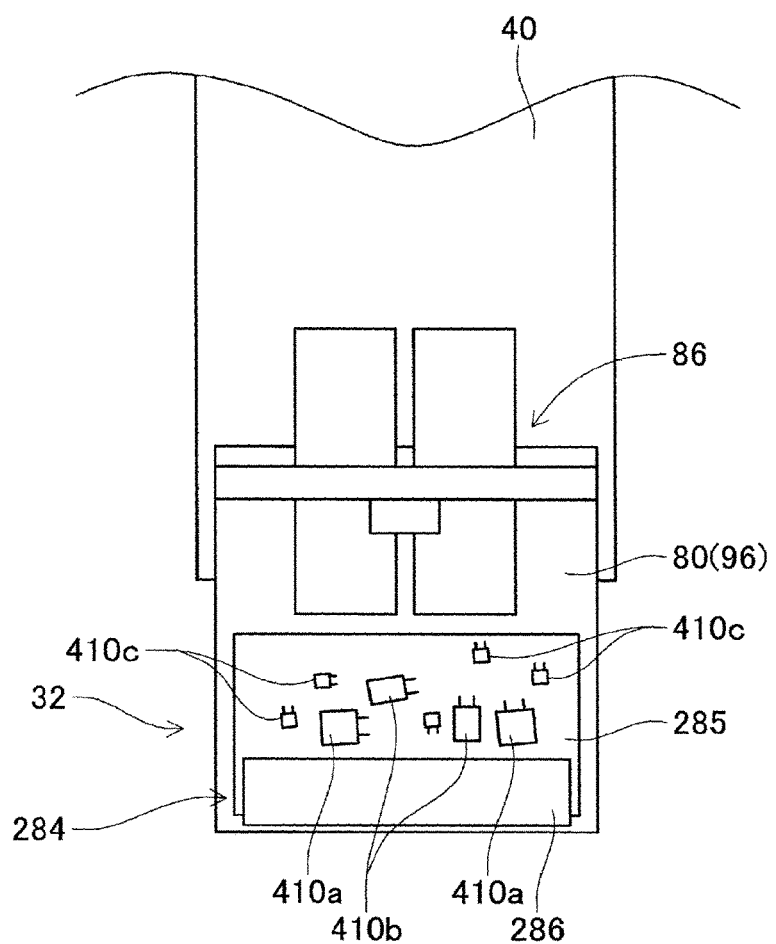
FIG. 9 is a plan view showing the loose component supply device with a component support unit attached.
Figure 10:
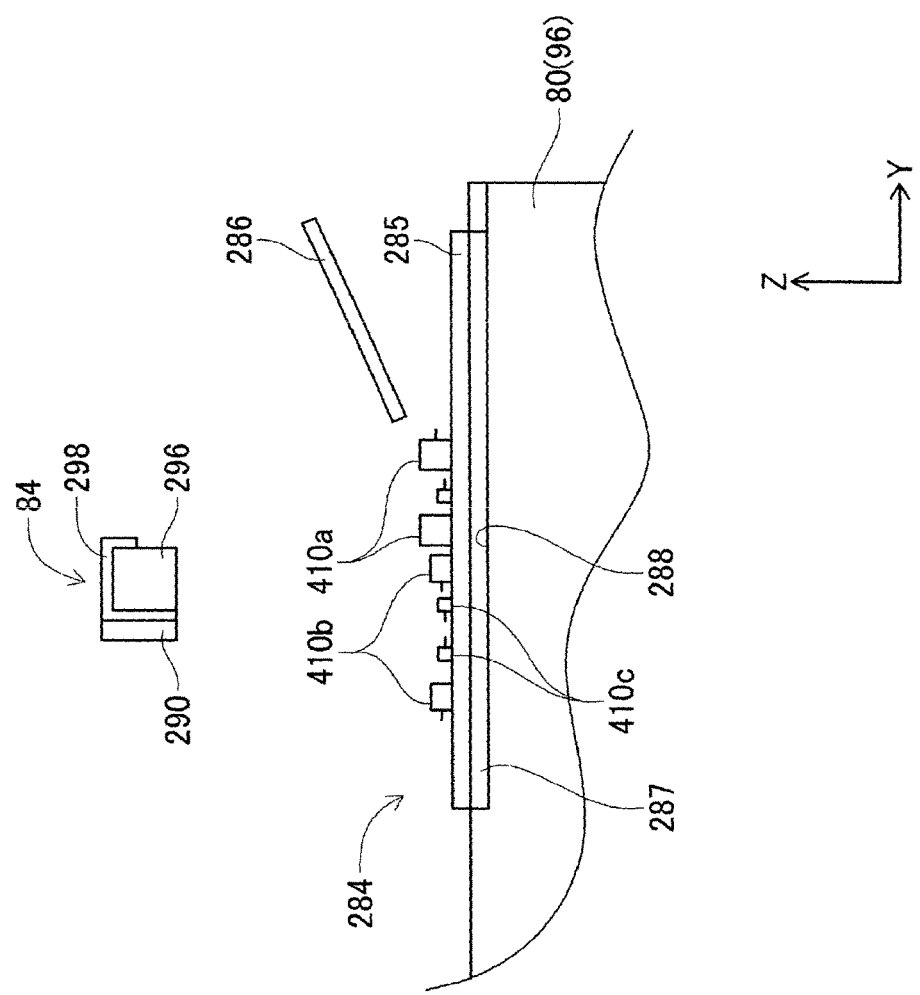
FIG. 10 is a side view of the component support unit.

Further, with loose component supply device 32, instead of component supply units 82, 280, and 282, as shown in FIG. 9, component support unit 284 may be attached to base 96. Specifically, as shown in FIGS. 9 and 10, component support unit 284 includes component support member 285 and inclined plate 286. Component support member 285 is a largely rectangular member, with the width of component support member 285 being approximately five times the width of component supply unit 82. Also, rails 287 are formed extending in a front-rear direction on the lower surface of component support member 285, with grooves 288 being formed extending in a front-rear direction on base 96 of main body 80. Further, rails 287 of component support member 285 engage with grooves 288 such that component support member 285 is slidable in the front-rear direction. By this, component support unit 284 is removably attached to base 96.

Also, inclined plate 286 is supported by a supporting mechanism (not shown) above a rear end section of component support member 285. Inclined plate 286 is inclined downwards towards the front side. The lower end of inclined plate 286 and the upper surface of component support member 285 are separated by a specified distance such that components on component support member 285 and inclined plate 286 do not interfere when component support member 285 is slid.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 88 so as to extend in the width direction of loose component supply device 32. Slider 298 is slidably attached to guide rail 296, and can be slid to any position by operation of electromagnetic motor (refer to FIG. 13) 299. Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 extending in the X direction, and Y slider 316 is moved to any position in the Y direction by operation of electromagnetic motor (refer to FIG. 13) 319. X-direction moving device 310 includes X slider 320 provided on a side surface of Y slider 316, and X slider 320 is moved to any position in the X direction by operation of electromagnetic motor (refer to FIG. 13) 321. Z-direction moving device 314 includes Z slider 322 provided on a side surface of X slider 320, and Z slider 322 is moved to any position in the Z direction by operation of electromagnetic motor (refer to FIG. 13) 323.

Figure 11:
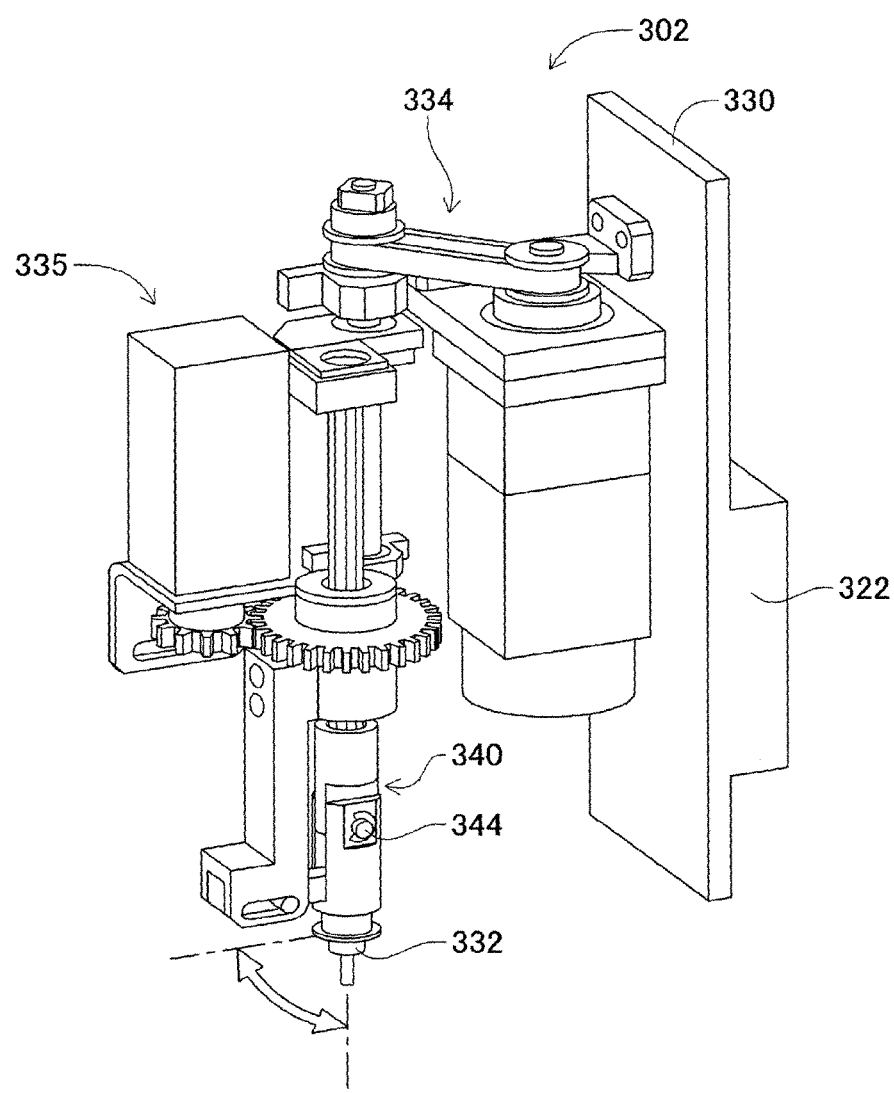
FIG. 11 is a perspective view of a component holding head.

As shown in FIG. 11, component holding head 302 includes head main body 330, suction nozzle 332, nozzle pivoting device 334, and nozzle rotating device 335. Head main body 330 is formed as one body with Z slider 322. Suction nozzle 332 picks up and holds a component using negative pressure and is attached to the lower end of nozzle holder 340. Nozzle holder 340 is able to bend at support shaft 344, and nozzle holder 340 bends 90 degrees by operation of nozzle pivoting device 334. By this, suction nozzle 332 attached to the bottom end of nozzle holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

As shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 12:
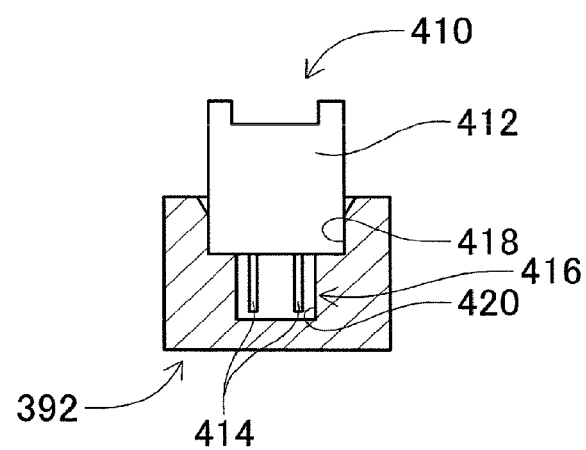
FIG. 12 shows a component receiving member.

In detail, as shown in FIG. 12, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open in the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

As shown in FIG. 3, component carrier moving device 390 is a long plate member provided on the front side of component supply unit 82 extending in the front-rear direction. Component carrier 388 is provided on the upper surface of component carrier moving device 390 to be slidable in the front-rear direction, and is slid to any position in the front-rear direction by operation of electromagnetic motor (refer to FIG. 13) 438. Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 13:
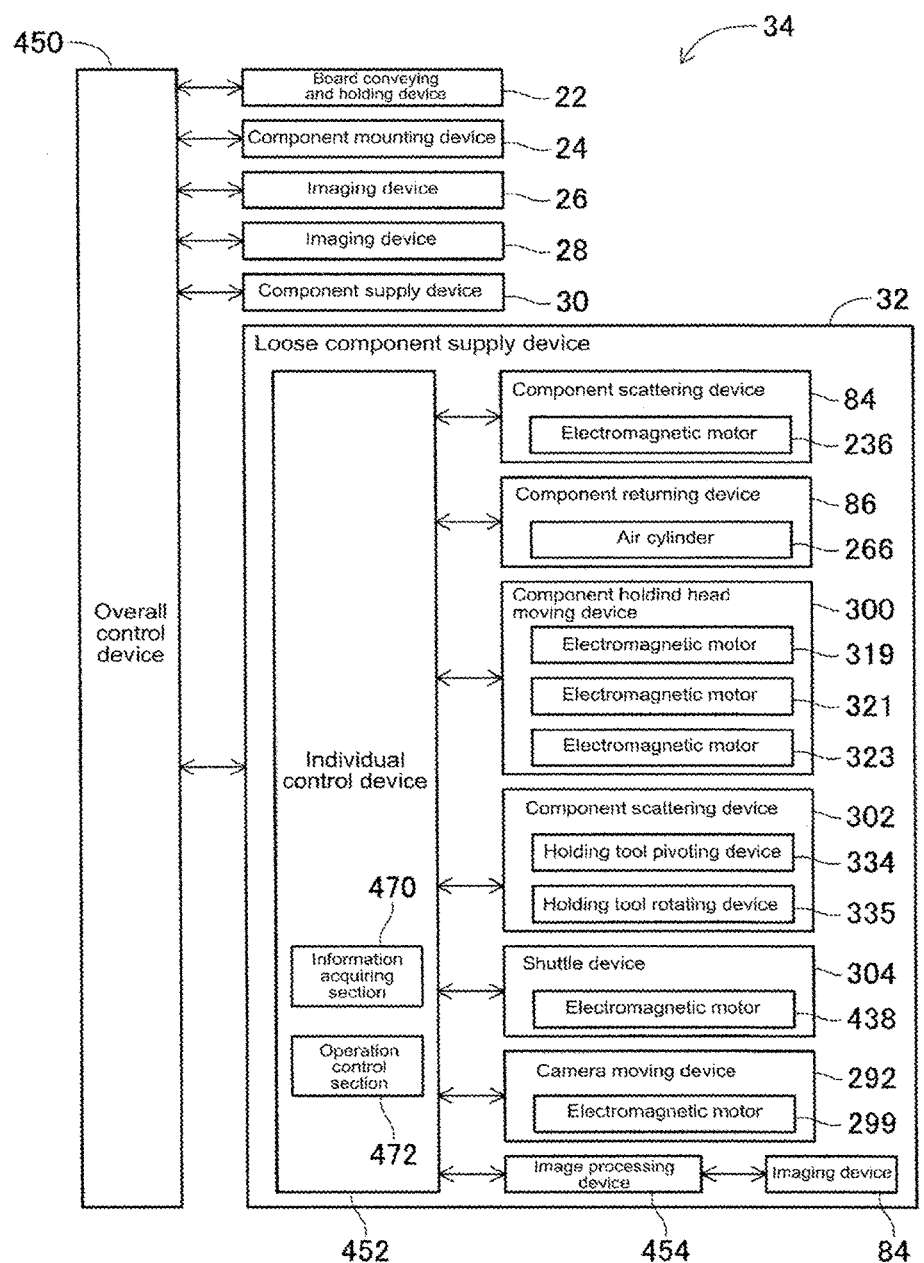
FIG. 13 is a block diagram showing a control device.

Further, as shown in FIG. 13, control device 34 includes overall control device 450, multiple individual control devices (only one is shown in the FIG. 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Accordingly, individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Further, image processing device 454 is connected to individual control device 452 of loose component supply device 32. By this, individual control device 452 of loose component supply device 32 acquires image data captured by imaging device 84.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using component holding tool 66. Then, work head 60 or 62 holding the component moves above imaging device 28, and the component being held by component holding tool 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into component storage apparatus 100 of component supply apparatus 88, then, the inserted leaded components 410 are supplied in a state loaded on component receiving member 392 of component carrier 388 by operation of component supply unit 82 and component transfer device 86. In detail, the operator inserts multiple types of leaded components 410 via the entrance in the top surface of component storage apparatus 100 of component supply apparatus 88. Here, component support member 220 is moved to the retract position below component supply apparatus 88 by operation of component support member moving device 222, and component collection container 262 is positioned in front of component supply apparatus 88.

Leaded components 410 inserted via the entrance on the top surface of component storage apparatus 100 fall onto inclined surface 116 of component storage apparatus 100 and spread out on inclined surface 116. Here, in a case in which leaded components 410 that have fallen onto inclined surface 116 roll and fall beyond inclined plate 152, they are collected in component collection container 262 positioned in front of component supply apparatus 88.

Figure 14:
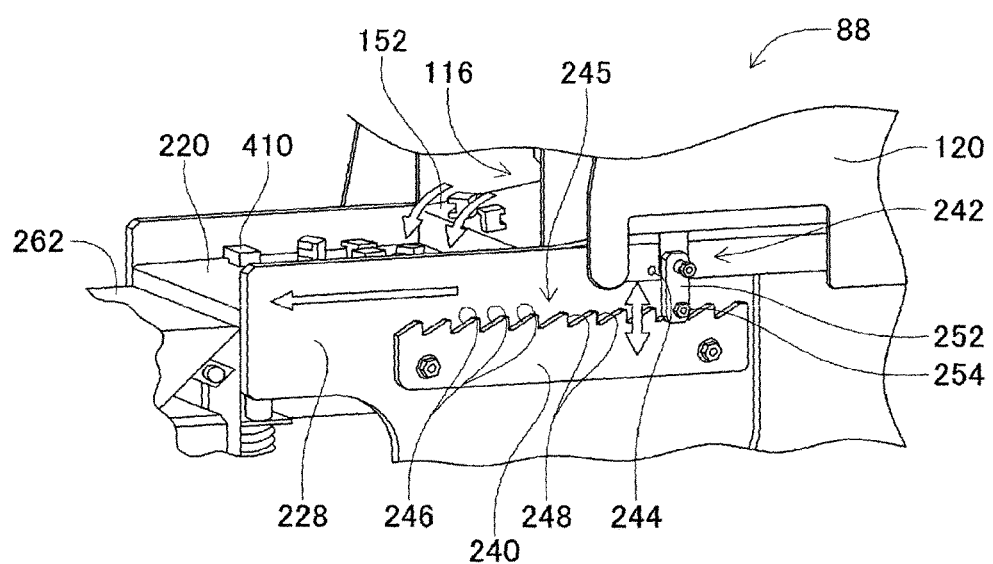
FIG. 14 is a perspective view of a component scattering device.

After leaded components 410 have been inserted into component storage apparatus 100, component support member 220 is moved forwards from below component supply apparatus 88 by operation of component support member moving device 222. Here, as shown in FIG. 14, as cam member 240 engages with cam follower 242, roller 254 of cam follower 242 rides over teeth 245 of cam member 240. Lever 252 of cam follower 242 is biased in a direction facing forwards by the elastic force of a coil spring, with the biasing forward of lever 252 being regulated by stopper 244. Therefore, when component support member 220 is moved forwards, roller 254 and teeth 245 are maintained in an engaged state, and roller 254 rides over teeth 245 without lever 252 being rotated forwards. Here, component supply apparatus 88 is raised by the riding over of teeth 245 by roller 254. That is, with roller 254 engaged with teeth 245, component support member 220 is moved forward, such that roller 254 rides over multiple teeth 245 and component supply apparatus 88 is oscillated by being consecutively moved up and down.

Leaded components 410 spread out on inclined surface 116 of component supply apparatus 100 are moved forwards by the oscillation of component supply apparatus 88 and the incline of inclined surface 116, and are ejected onto the upper surface of component support member 220 via inclined plate 152. Here, leaded components 410 are prevented from falling from component support member 220 by side wall sections 228 of component support member 220. And, by component support member 220 being moved to the component supply position, multiple leaded components 410 are scattered on the upper surface of component support member 220. However, because the width of component supply member 220 is relatively narrow, there are cases in which leaded components 410 are not scattered suitably if they are large or if there are many of them.

Thus, if the leaded components 410 to be supplied are large, or if the quantity of leaded components 410 to be supplied is relatively large, instead of component supply unit 82, component supply unit 280 or component supply unit 282 is attached to base 96 of main body 80. In this case, multiple types of leaded components 410 are inserted into the component storage apparatus of component supply unit 280 or 282, and the component scattering device of component supply unit 280 or 282 scatters the leaded components 410 on the component support member of component supply unit 280 or 282 by operating in a similar manner to component scattering device 90 of component supply unit 82. By this, even large leaded components 410 and a large quantity of leaded components 410 can be scattered suitably on the relatively wide component support member.

Further, if even larger leaded components 410 are to be supplied, or an even larger quantity of leaded components 410 is to be supplied, instead of component supply units 82, 280, or 282, component support unit 284 is attached to base 96 of main body 80. Then, an operator directly supplies multiple types of leaded components 410 onto inclined plate 286 of component support unit 284. That is, with component support unit 284, unlike with component supply apparatus 88 of component supply units 82, 280, and 282, the operator drops leaded components 410 directly onto inclined plate 286, not via component storage apparatus 100 or the like.

When leaded components 410 are supplied onto inclined plate 286, those leaded components 410 roll on inclined plate 286 and fall onto component support member 285. By this, as shown in FIGS. 9 and 10, leaded components 410 are scattered on component support member 285. In this manner, by attaching component support unit 284 to base 96 instead of attaching component supply unit 82, 280, or 282, even large leaded components 410 and a large quantity of leaded components 410 can be scattered suitably on the relatively wide component support member 285. Also, compared to component supply units 82, 280, and 282, component support unit 284 has a relatively simple configuration, making it extremely beneficial in terms of cost. Note that, in FIGS. 9 and 10, when three types of leaded components 410a, 410b, and 410c are supplied to inclined plate 286, those three types of leaded components 410a, 410b, and 410c are shown scattered on component support member 285.

According to the procedure described above, when the multiple types of leaded components 410 are scattered on component support member 220 of component supply unit 82, 280, or 282, or on component support member 285 of component support unit 284, camera 290 of imaging device 84 is moved above the component support member 220 or 285 on which the leaded components 410 are scattered by operation of camera moving device 292, and the leaded components 410 are imaged. Then, based on the image data captured by camera 290, a leaded component that is a target for pickup (hereinafter also referred to as "pickup target component") is held by a suction nozzle 332 of component holding head 302. Here, as described above, multiple types of leaded components 410 are scattered on component support member 220 of component supply unit 82, 280, or 282, or on component support member 285 of component support unit 284. Therefore, the pickup target components are identified from the multiple types of leaded components 410.

Figure 15:
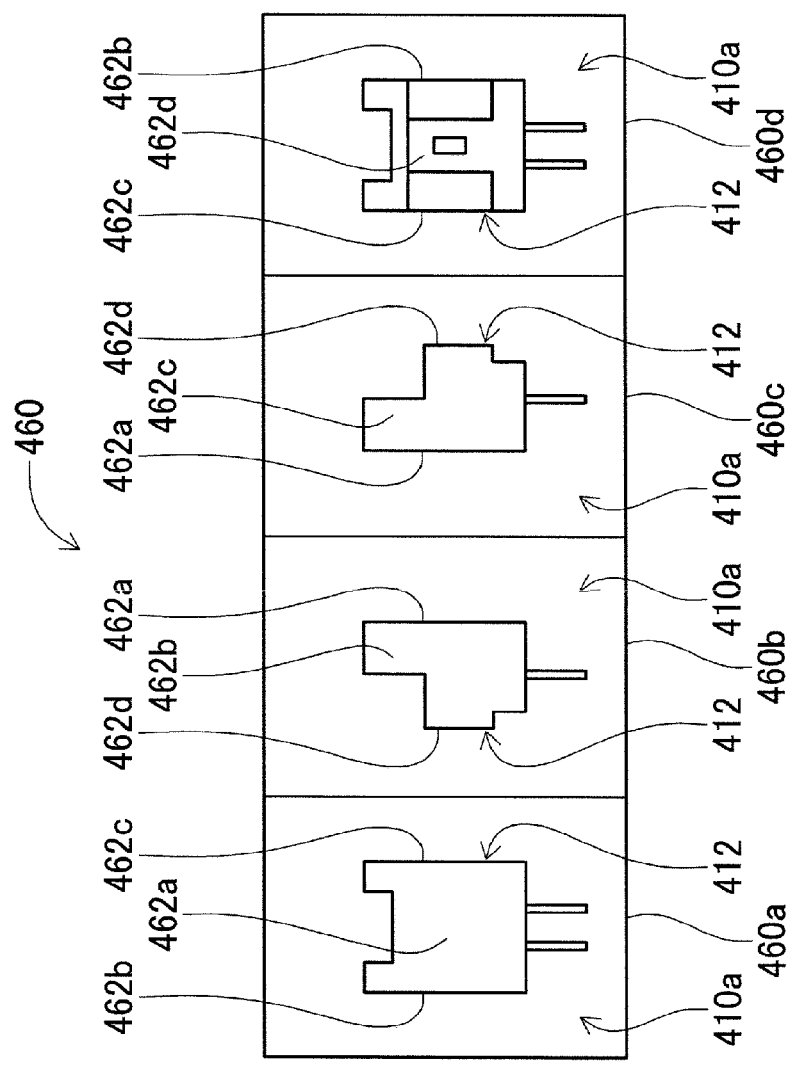
FIG. 15 conceptually shows identification information.

Descriptions will be given specifically in a case, as shown in FIGS. 9 and 10, when three types of leaded components 410a, 410b, and 410c are scattered on component support member 285 of component support unit 284, and leaded component 410a is the pickup target component. Information for identifying leaded components 410 (hereinafter also referred to as "identification information") is stored in individual control device 452 of loose component supply device 32. Identification information is information related to the form of each leaded component 410 supplied by loose component supply device 32, and is configured from information representing the form of four side surfaces of leaded components 410. FIG. 15 conceptually shows identification information 460 of leaded component 410a as an example of identification information of a leaded component 410.

Identification information 460 of leaded component 410a includes information 460a representing the form of leaded component 410a seen from specified side surface 462a from the four side surfaces of component main body 412 of leaded component 410a, information 460b representing the form of leaded component 410a seen from side surface 462b that is adjacent to side surface 462a, information 460c representing the form of leaded component 410a seen from side surface 462c that is opposite to side surface 462b, and information 460d representing the form of leaded component 410a seen from side surface 462d that is opposite to side surface 462a.

Note that, individual image data of each of the multiple leaded components 410 scattered on component support member 285 (hereinafter "individual image data") is included in the image data of camera 290. Therefore, the multiple pieces of individual image data included in the image data of camera 290 and the identification information stored in individual control device 452 are compared, and items that match identification information 460 of leaded components 410a are extracted from those multiple pieces of individual image data. And, a leaded component 410 corresponding to the extracted individual image data is identified as a pickup target component.

When a pickup target component is identified, the position of the pickup target component and orientation of the pickup target component are calculated based on the image data of camera 290. Then, based on the calculated position of the pickup target component and orientation of the pickup target component, operation of component holding head moving device 300 is controlled. By this, component holding head 302 moves above the pickup target component and the pickup target component is picked up and held using suction nozzle 332. Note that, when the pickup target component is picked up and held by suction nozzle 332, suction nozzle 332 is in the non-pivoted position.

After leaded component 410 has been picked up by suction nozzle 332, component holding head 302 is moved above component carrier 388, and here, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception member 392. By this, leaded component 410 is loaded in component receiving member 392 with leads 414 facing vertically downwards. Then, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In the manner, with loose component supply device 32, leaded components 410 are supplied with leads 414 pointing downwards, and with the surface opposite the surface to which the leads are connected facing upwards. Therefore, component holding tool 66 of work head 60 or 62 is able to appropriately hold leaded component 410.

Also, with a conventional loose component supply device, only one type of leaded component 410 can be supplied by one component supply unit 82, 280, or 282. That is, only one type of leaded component 410 can be inserted into component storage apparatus 100 of one component supply unit 82, 280, or 282. Therefore, even when five component supply units 82 are attached to base 96, at most five types of leaded components 410 can be supplied, meaning that convenience is poor. Also, it is necessary to distinguish the types of leaded components 410 for each component supply unit 82, 280, and 282, meaning the burden on operators is large. Conversely, with loose component supply device 32, multiple types of leaded components 410 are supplied in one component supply unit 82, 280, or 282, or one component support unit 284, with any pickup target component from the multiple types of leaded components 410 being picked up. Thus, with loose component supply device 32 it is possible to supply five or greater leaded components 410, and usability is improved. Also, there is no need for an operator to identify the types of leaded components 410 by each component supply unit 82, 280, or 282, or component support unit 284, thereby reducing the burden on operators.

Note that, as shown in FIG. 13, individual control device 452 includes information acquiring section 470 and operation control section 472. Information acquiring section 470 is a functional section for acquiring information related to individual image data and the position of a pickup target component based on image data of camera 290. Operation control section 472 is a functional section for controlling operation of component holding head moving device 300 and component holding head 302 based on information related to the position of a pickup target component and individual image data.

(b) Collection of Leaded Components

Figure 16:
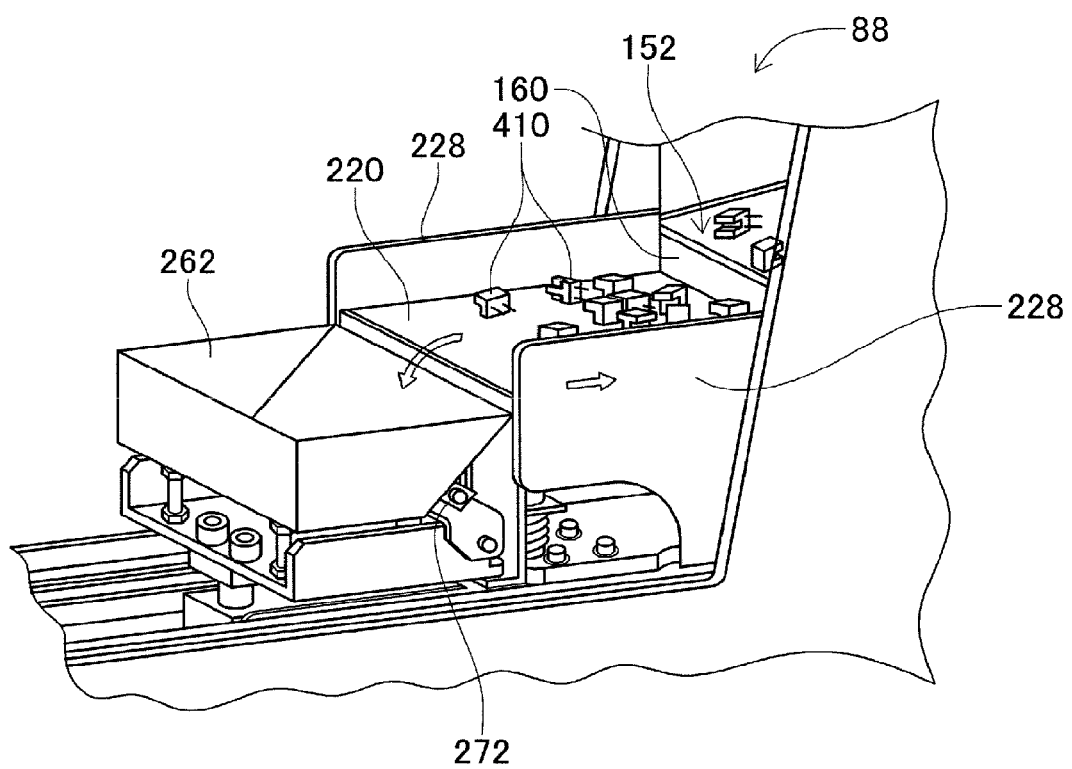
FIG. 16 is a perspective view of a component scattering device and a component returning device.

Further, with loose component supply device 32, leaded components 410 scattered on component support member 220 or 285 can be collected. In detail, in a case in which component supply unit 82, 280, or 282 is attached to base 96, first, component support member 220 is moved below component supply apparatus 88 by operation of component support member moving device 222. Here, as shown in FIG. 16, leaded components 410 on component support member 220 are stopped by inclined plate 152 of component supply apparatus 88. By this, leaded components 410 on component support member 220 are scraped into component collection container 262.

When component support member 220 is moved below component storage apparatus 88, component collection container 262 moves up by operation of container raising and lowering device 260. Here, as shown in FIG. 6, protruding pin 272 provided on component collection container 262 engages with engaging block 274 provided on the inside of side frame section 190. By this, component collection container 262 is rotated, and the bottom surface of component collection container 262 becomes vertical. Therefore, all the leaded components 410 inside component collection container 262 are returned inside component storage apparatus 100.

By an operator gripping the grip of component supply apparatus 88, as described above, component supply apparatus 88 is unlocked, and by the operator raising component supply apparatus 88, component supply apparatus 88 is removed from the pair of side frame sections 190. By this, leaded components 410 are collected outside of loose component supply device 32 by leaded components 410 being removed from component supply apparatus 88.

Also, in a case in which component support unit 284 is attached to base 96, an operator removes component support member 285 from base 96 by sliding component support member 285 in a direction away from base 96. By this, leaded components 410 scattered on component support member 285 are collected outside of loose component supply device 32. In this manner, with component support unit 284, it is possible to collect leaded components 410 using a mechanism construction that is extremely simple, which is highly convenient from a cost perspective.

Further, the present disclosure is not limited to the above example embodiments, and various changed or improved methods of embodiment are possible based on the knowledge of someone skilled in the art. Specifically, for example, in the above embodiment, component supply device 280 and 282 with a width twice or three times as wide as component supply unit 82 are used, but a component supply unit of any width may be used. Also, component support unit 284 with a width five times that of component supply unit 82 is used, but a component support unit of any width may be used.

Also, with the above embodiment, as information for identifying leaded components 410, information related to the form of leaded components 410 is used, but various types of identification information may be used. For example, in a case in which an ID or the like is provided on leaded component 410, the ID may be used as identification information.

REFERENCE SIGNS LIST

32: loose component supply device (component supply device); 82: component supply unit; 84: imaging device; 88: component supply apparatus (storage section); 96: base (attachment section); 220: component support member (component support section); 280: component supply unit; 282: component supply unit; 285: component support member (component support section); 286: inclined plate (inclined section); 300: component holding head moving device (moving device); 332: suction nozzle (holding tool); 452: individual control device (control device); 470: information acquiring section; 472: operation control section

The invention claimed is:

1. A component supply device comprising:
   a component support section configured to support multiple types of components in a scattered state;
   an imaging device configured to image the component supported by the component support section, and configured to move relative to the component support section;
   a holding tool configured to hold the component supported by the component support section;
   a moving device configured to move the holding tool to any position above the component support section; and
   a control section configured to control operation of the holding tool and the moving device,
   wherein the control section includes
      an information acquiring section configured to acquire identification information for identifying each type of the multiple types of components and position information representing a position of each of the multiple types of components on the component support section, based on image data imaged by the imaging device, and
      an operation control section configured to control operation of the holding tool and the moving device based on the identification information and the position information acquired by the information acquiring section, such that any type of the multiple types of components supported by the component support section can be held by the holding tool.

2. The component supply device according to claim 1, further comprising
   an inclined section via which the multiple types of components can be supplied by an operator,
   wherein the component support section supports the multiple types of components in a scattered state, the multiple types of components having fallen from the inclined section.

3. The component supply device according to claim 1, further comprising
   a storage section configured to store the multiple types of components,
   the component support section configured to support the multiple types of components in a scattered state, the multiple types of components having been discharged from an opening of the storage section, and
   an attachment section to and from which a component supply unit can be attached and detached, the component supply unit being configured from the storage section and the component support section.

4. The component supply device according to claim 3, further comprising
   multiple of the component supply units having different widths,
   wherein each of the multiple component supply units is detachably attached to the attachment section.

5. The component supply device according to claim 1, further comprising:
   a slider connected to the imaging device that moves the imaging device along a guide rail relative to the component support section.

6. A component supply device comprising:
   a component support section configured to support multiple types of components in a scattered state;
   an imaging device configured to image the component supported by the component support section;
   a holding tool configured to hold the component supported by the component support section;
   a moving device configured to move the holding tool to any position above the component support section;
   a storage section configured to store the multiple types of components, the component support section configured to support the multiple types of components in a scattered state, the multiple types of components having been discharged from an opening of the storage section;
   an attachment section to and from which a component supply unit can be attached and detached, the component supply unit being configured from the storage section and the component support section;
   a control section configured to control operation of the holding tool and the moving device,
   wherein the control section includes
      an information acquiring section configured to acquire identification information for identifying each type of the multiple types of components and position information representing a position of each of the multiple types of components on the component support section, based on image data imaged by the imaging device, and
      an operation control section configured to control operation of the holding tool and the moving device based on the identification information and the position information acquired by the information acquiring section, such that any type of the multiple types of components supported by the component support section can be held by the holding tool,
   wherein multiple of the component supply units having different widths, and
   wherein each of the multiple component supply units is detachably attached to the attachment section.

* * * * *